(12) United States Patent
Kirihata (10) Patent No.: US 6,243,306 B1
(45) Date of Patent: Jun. 5, 2001

(54) DEFECT MANAGEMENT ENGINE FOR GENERATING A UNIFIED ADDRESS TO ACCESS MEMORY CELLS IN A PRIMARY AND A REDUNDANCY MEMORY ARRAY

(75) Inventor: Toshiaki Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/619,257

(22) Filed: Jul. 19, 2000

(51) Int. Cl.$^7$ .................................................. G11C 7/00
(52) U.S. Cl. ...................................... 365/200; 365/189.07
(58) Field of Search ................................. 365/200, 201, 365/230.03, 185.09, 230.06, 189.07

(56) References Cited

U.S. PATENT DOCUMENTS

| | | | |
|---|---|---|---|
| 5,469,390 | 11/1995 | Sasaki et al. | 365/200 |
| 5,691,952 | 11/1997 | Sasaki et al. | 365/230.08 |
| 5,831,914 | 11/1998 | Kirihata | 365/200 |
| 5,881,003 | 3/1999 | Kirihata | 365/200 |
| 5,920,515 * | 7/1999 | Shaik et al. | 365/200 |
| 6,118,710 * | 9/2000 | Tsuji | 365/200 |
| 6,141,267 * | 10/2000 | Kirihata et al. | 365/200 |

OTHER PUBLICATIONS

"A 14-ns 4-mb CMOS DRAM with 300-mW Active Power", published in the IEEE Journal of Solid State Circuits, vol. 27, pp. 1222–1228, Sep. 1992, Toshiaki Kirihata, et al.

"Fault-Tolerant Designs for 256 Mb DRAM", published in the IEEE Journal of Solid State Circuits, vol. 31, pp. 558–566, Apr. 1996, Toshiaki Kirihata, et al.

"256-Mb DRAM Circuit Technologies for File Applications", published in the IEEE Journal of Solid State Circuits, vol. 28, pp. 1105–1113, Nov. 1993.A, Goro Kitsukawa, et al.

U.S. application No. 09/243,645, "Defect Management Engine for Semiconductor Memories and Memory Systems", filed Feb. 3, 1999.

U.S. application No. 08/895,061, Variable Domain Redundancy Replacement Configuration for a Memory Device:, filed Jul. 16, 1997.

* cited by examiner

*Primary Examiner*—Tan T. Nguyen
(74) *Attorney, Agent, or Firm*—H. Daniel Schnurmann (57) ABSTRACT

A method and apparatus for eliminating defects present in memory devices by way of a defect management engine (DME) is described. The DME integrates a plurality of defective address cells and redundancy address cells within an array. The defective address cells store addresses for accessing defective cells in a main memory. The redundancy address cells store addresses for accessing redundancy cells within a redundancy memory. The address data in the defective address cells is compared to the address input of the DME, thereby providing a redundancy match detection scheme. When no match occurs, the DME outputs the address input of the DME, which allows the main memory to be accessed when operating in a normal mode. When a match occurs, the DME outputs the address read from the redundancy address cells, which allows the redundancy memory to be accessed when operating in a redundancy mode.

19 Claims, 8 Drawing Sheets

× DEFECTIVE ELEMENT

FIG. 1(c) PRIOR ART

× DEFECTIVE ELEMENT

FIG. 1(d) PRIOR ART

× DEFECTIVE ELEMENT

DEFECT MANAGEMENT ENGINE FOR GENERATING A UNIFIED ADDRESS TO ACCESS MEMORY CELLS IN A PRIMARY AND A REDUNDANCY MEMORY ARRAY

FIELD OF THE INVENTION

This invention is related, generally, to semiconductor memory devices and, more particularly, to a method and apparatus for eliminating defects present in these memory devices by way of a defect management engine.

BACKGROUND OF THE INVENTION

CMOS technology has evolved at such a brisk pace that the computer market has rapidly opened to a wide range of consumers. Today multi-media computers require at least 32 MB, which increases the relative cost of the memories within the computer. In the near future, 64 MB or 128 MB computers will become commonplace, which suggests a potentially strong demand for 256 Mb DRAMs (Dynamic Random Access Memory) and beyond. Despite the huge size of the memory arrays and the lithographic difficulties that ensue, it is even more important then ever to increase the yield of the memory devices and memory system containing a plurality of the DRAMs. Process engineers constantly struggle to reduce, and ultimately eliminate defects to improve yields. Faults which will inevitably remain in the chips and system, are generally overcome using special circuit designs, most notably, redundancy replacement configurations.

Figure 1A:
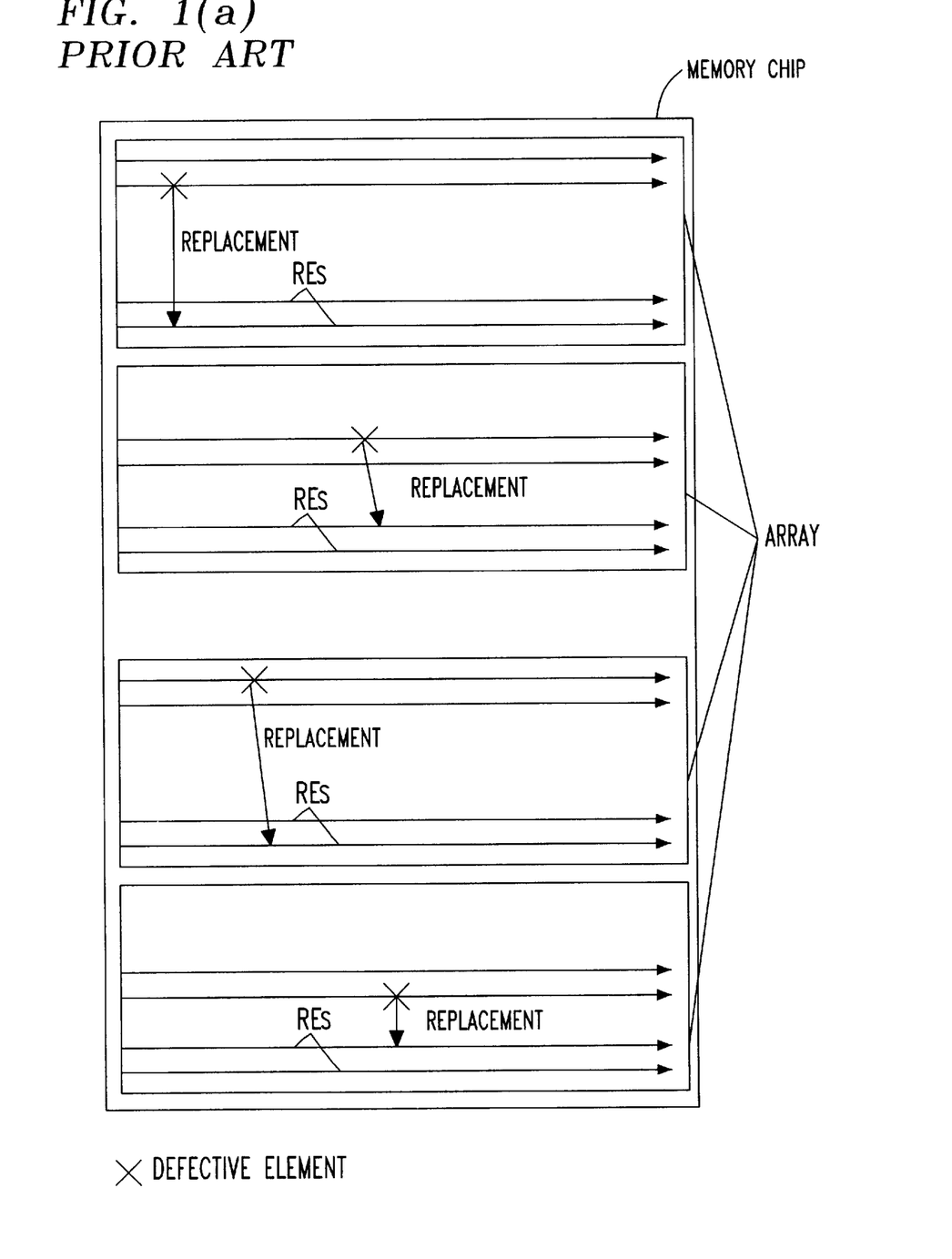
FIG. 1a illustrates a conventional on-chip redundancy replacement scheme organized in an intra-array arrangement.

An on-chip redundancy architecture which is commonly used for low density DRAMs is shown in FIG. 1(a). This configuration assigns a limited number of redundancy rows and redundancy columns to each block, which are then used within each corresponding sub-block. This intra-block replacement configuration, however, increases the redundancy area overhead as the number of sub-arrays increases in highdensity DRAMs, since each block must be provided with at least one or, preferably, two redundancy elements (REs). The effectiveness of the redundancy elements is poor because of its inherent inflexibility, further reducing the chip yield when faults are clustered in a certain sub-block. This intra-block replacement is described in the article by T. Kirihata et al., entitled "A 14 ns 4 Mb DRAM with 300 mW Active Power", published in the IEEE Journal of Solid State Circuits, vol. 27, pp. 1222–1228, Sep. 1992.

Figure 1B:
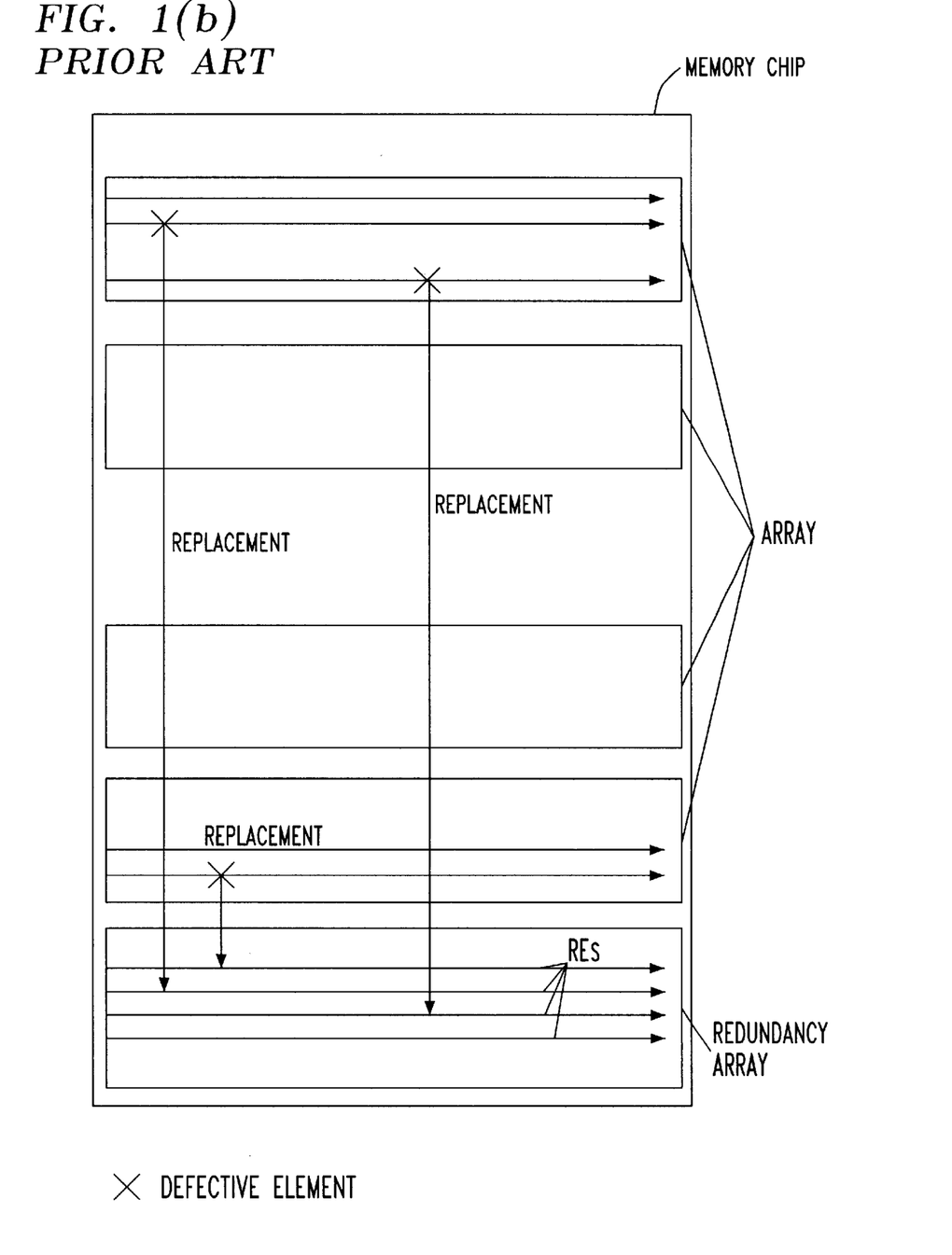
FIG. 1b illustrates a conventional on-chip redundancy replacement scheme used in a redundancy array configuration.

Another on-chip redundancy architecture, which was primarily developed for high-density DRAMs is shown in FIG. 1(b), in which all the redundancy elements are clustered in one redundancy array. These elements are used for repairing faults in several of the sub-arrays. This added flexibility allows sharing redundancy elements and control circuits among several sub-blocks, thereby significantly increasing the effectiveness of the redundancies present therein. Because of this effectiveness, it requires less redundancy elements and control circuits, while allowing good reparability especially for wordlines (WL), bitlines (BL), and column-select lines (CSL) faults. The effectiveness or flexibility of the aforementioned repair configuration is, however, limited to its use within a chip—a distinct drawback when repairing a substantial number of retention faults. More details on this flexible redundancy replacement may be found in an article by T. Kirihata et al., entitled "A Fault-Tolerant Design for 256 Mb DRAM", published in the IEEE Journal of Solid State Circuits, vol. 31, pp. 558–566, April 1996.

Figure 1C:
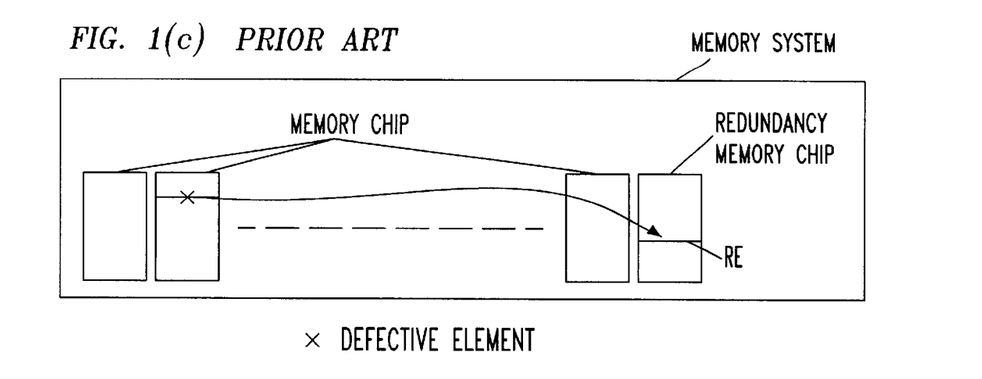
FIG. 1c is a schematic block diagram illustrating a prior art system representation that includes a plurality of redundancies linked to a redundancy memory chip.

Semiconductor memory systems equipped with a spare or redundant chip make it possible to extend repairability to the system level. Herein, a defective chip containing a defective element can be repaired with redundancy elements located in the redundancy chip, as shown in FIG. 1(c). The effectiveness of the memory system is drastically improved over on-chip redundancy because it allows using the chip containing the defect. However, the added requirement of an added redundancy chip containing complex redundancy replacement and control circuitry makes this approach costly. It is questionable whether or not the added cost can be paid off by an improvement in yield at the system level. On-chip redundancy is a lesser expensive approach and, therefore, more common to existing memory systems. A sample configuration of a system level redundancy that includes a spare or relief chip is described in Japanese Patent Document No. JP-A-1-269229 and in U.S. Pat. No. 5,691,952. The latter configures the chip in a plurality of 'mats', enabling to isolate the power supply from a faulty 'mat'. This approach is efficient for repairing a block fault (i.e., a large clustered fault), since designing a block redundancy in each chip (i.e., on-chip block redundancy) is generally inefficient, as was discussed in the aforementioned U.S. Pat. No. 5,691,952. A typical on-chip block redundancy is described in an article by G. Kistukawa et al., "256 Mb DRAM circuit technologies for file applications", published in the IEEE Journal of Solid State Circuits, vol. 28, pp.1105–1113, November 1993.

Figure 1D:
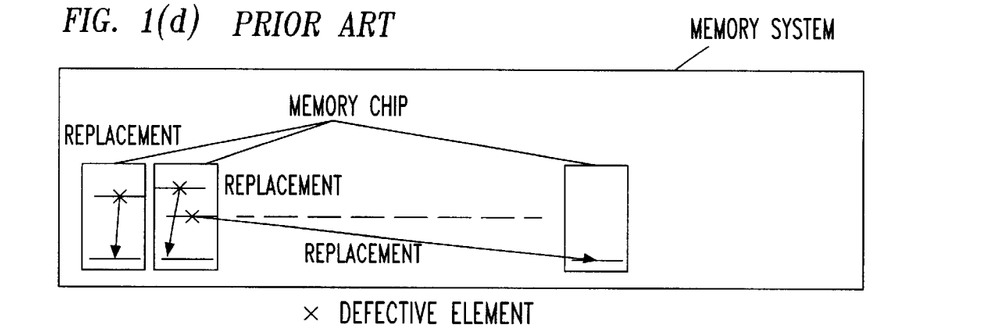
FIG. 1d is a schematic block diagram illustrating a prior art system showing redundancy elements located in other chips for curing defects in a given chip.

Sasaki, in U.S. Pat. No. 5,469,390 describes a semiconductor system wherein defects in a given chip are cured with repair elements located in some other chip. This approach is effective for relieving faults at system level, because a defective unrepairable element can be replaced with an unused redundancy element present elsewhere, when all existing repair circuits available on the chip have already been exhausted, as it is shown in FIG. 1(d). This approach, however, requires more complex redundancy circuitry to enable this flexibility, thereby substantially increasing its cost. Moreover, this technique is not applicable to certain types of conventional memory modules such as SIMM (Single In-line Memory Module) or DIMM (Dual In-Line Memory Module) because all the chips within the module are generally accessed simultaneously. (Note that an I/O terminal must be used for the chip to be activated). Although an inactive chip located in a separate module can theoretically be used for system redundancy, this approach is too complex and expensive for its universal use at the system level.

Figure 1E:
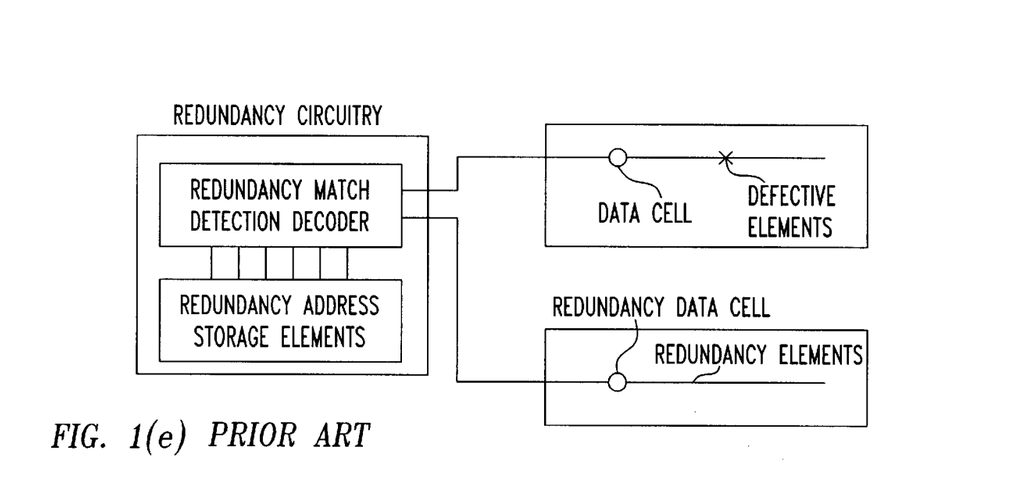
FIG. 1e illustrates a block diagram applicable to a chip or to a system showing how conventional redundancy circuitry replaces a defect.

Regardless whether on-chip redundancies or system level redundancies are used, the method of redundancy replacement shown in FIG. 1(e) uses redundancy elements consisting of a plurality of redundancy data cells, redundancy circuitry consisting of a plurality of redundancy address storage elements for storing an address to determine a defective element, and a plurality of redundancy match detection decoders organized as separate and independent blocks. Furthermore, within the redundancy circuitry, the redundancy address storage elements and the redundancy match detection decoders are also arranged as separate and independent blocks. This makes it difficult to effectively share the redundancy match detection decoders if the number of redundancy address storage elements is large. If the redundancy address elements are organized in a two dimensional array, it is more effective to share the redundancy match detection decoders than in a one dimensional arrangement. However, conventional redundancy address storage elements use fuses, which are difficult to arrange as an array. Even if the redundancy address storage elements are arranged in a matrix formation with non-volatile memories, such as an EPROM or EEPROM, no effective method is known for sharing the redundancy match detection decoders. In conclusion, no prior art has been identified for providing an effective method of using redundancy elements consisting of a plurality of redundant cells, redundancy circuitry consisting of a plurality of redundancy address storage elements and a plurality of redundancy match detection decoders, while improving the chip and/or the memory system yield.

Figure 1F:
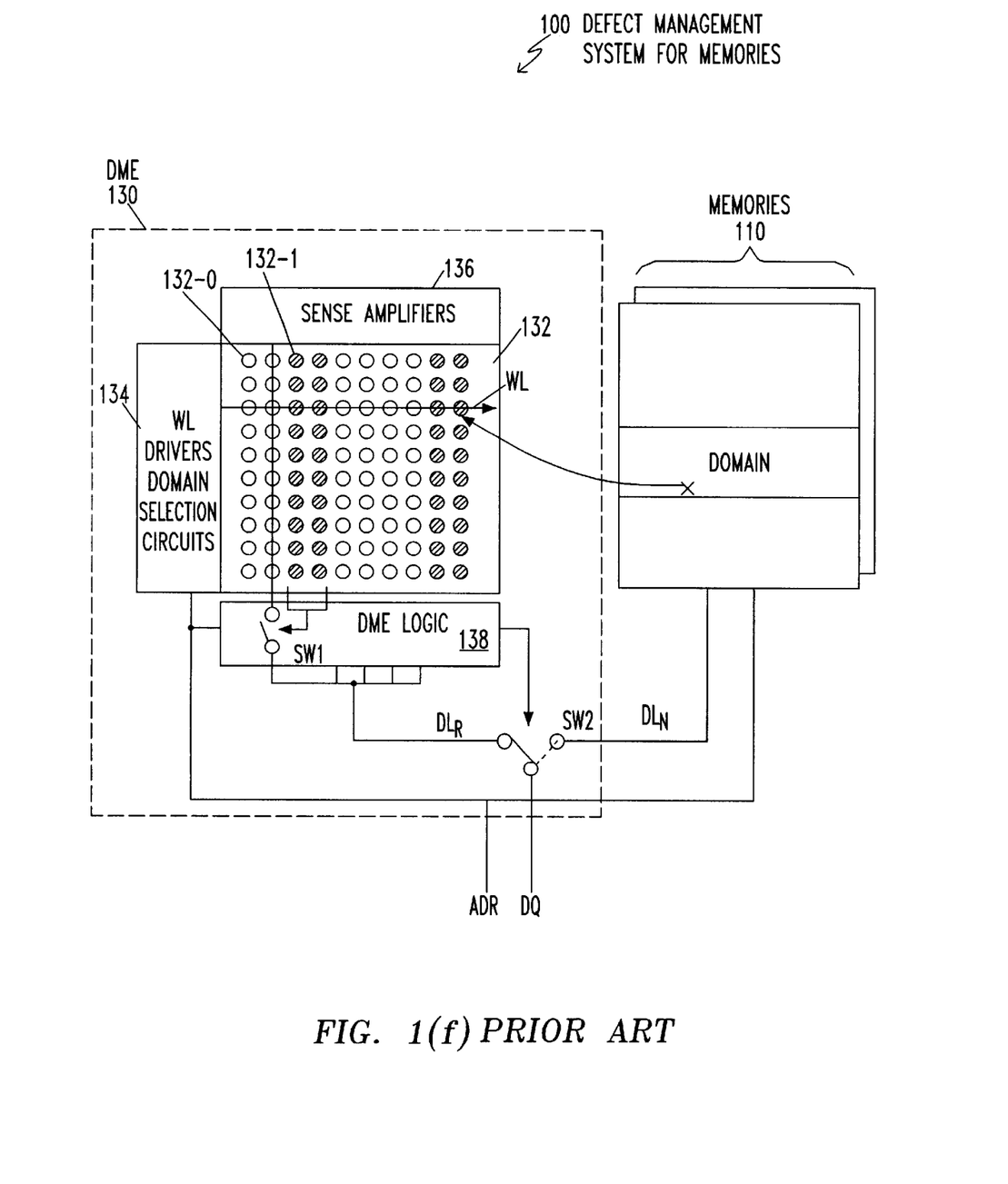
FIG. 1f illustrates a block diagram of a defect management engine linked to a plurality of memories, according to the previous invention.

Referring now to FIG. 1(f), there is shown a defect management engine (DME), as described in U.S. patent application Ser. No. 09/243,645, servicing a plurality of memories 110 in a system 100. These memories 110 include any and all types of on-chip or off-chip memory devices. The DME enables redundancies included therein to be advantageously used for repairing faults (labeled X) found in a domain within the memories 110. DME 130 consists of a memory array 132, wordline (WL) drivers 134, sense amplifiers 136, and DME logic 138. Unlike conventional redundancy arrays which are provided with only redundancy data cells (see FIG. 1(b)), the DME memory array 132 includes redundancy data cells 132-0 as well as redundancy address cells 132-1. Redundancy data cells 132-0 are used for replacing defective cells within the memories 110. The address cells 132-1, on the other hand, store the addresses which identify the location of the defective cells within the memories 110.

For convenience sake, all memories 110 are divided into a plurality of domains, the size of which are not necessarily the same. WLs in DME 130 are assigned to a given domain within the various memories 110 for handling defective cells within that domain. By assigning a different number of WLs to a corresponding domain, the repairability of the domains becomes variable, thus setting the stage for a variable number redundancy replacement per domain. A more detailed description of the variable size redundancy replacement technique is described in U.S. Pat. No. 5,831,914. WL drivers 134 activate the redundancy data cells 132-0 as well as the redundancy address cells 132-1 when a corresponding domain within the memory 110 is selected. The domain size can also be variable, allowing for a variable domain redundancy replacement. Further description of a variable domain redundancy replacement may be found in U.S. Pat. No. 5,831,914. Sense amplifiers 136 amplify simultaneously the data bits from the redundancy data cells 132-0, the redundancy addresses (ADRD) from the redundancy address cells 132-1. (Note: the sense amplifiers may not be necessary in the event where the redundancy address or data cells have already sufficient cell gain, e.g., in an SRAM or EPROM). The DME logic 138 activates a self-contained redundancy match detector which compares the address inputs ADR (coupled to the DME logic 138), with a redundancy address ADRD read from the redundancy address cell 132-1. As a result, signals are generated showing a 'MATCH' (ADR= ADRD) or, conversely, a 'NO-MATCH' (ADR≠ADRD) condition. MATCH initiates a self-contained redundancy replacement by opening a first switch SW1 and transferring the redundancy data bit from the redundancy data cells 132-0 to the data-line $DL_R$. Concurrently, a second switch SW2 couples DLR to DQ. The NO-MATCH condition maintains SW1 in its normal closed position, and switch SW2 couples $DL_N$ to DQ (which is linked to memories 110), in order to access the memory. A more detailed description can be found in U.S. patent application Ser. No. 08/895,061.

In conclusion, the previous DME 130 fully integrates a plurality of redundancy circuits consisting of self-contained domain selectors by WL drivers 134, self-contained redundancy match detectors by DME logic 138, and self-contained redundancy replacements by redundancy data cells (132-0)and redundancy address cells (132-1), all within a single memory chip, enabling in the process a variable number of redundancy replacements per domain; a variable domain redundancy replacement and a variable number of bit replacement.

This fully integrated DME is particularly advantageous or a low cost memory system. However, the fully integrated DME is not preferable for a high performance memory system, since the DQ switching between the DME and a defective memory device is difficult at high frequencies. An on-chip DME may overcome this problem, however providing a DME in each chip is expensive.

OBJECTS OF THE INVENTION

Accordingly, it is an object of the present invention to provide a defect management engine for generating a unified address to access memory cells in a primary memory array and redundancy cells in a redundancy memory array.

It is a further object of the invention to provide a defect management engine for accessing memory cells in a primary memory array and redundancy cells in a redundancy memory array by way of a unified addressing method in order to perform a row redundancy redundancy replacement.

It is a further object of the invention to provide a defect management engine for accessing memory cells in a primary memory array and redundancy cells in a redundancy memory array by way of a unified addressing method in order to perform a variable size redundancy replacement.

It is a further object of the invention to provide a defect management engine for accessing memory cells in a primary memory array and redundancy cells in a redundancy memory array by way of a unified addressing method in order to perform a variable domain redundancy replacement.

SUMMARY OF THE INVENTION

In one aspect of the invention, there is provided a method and an apparatus for eliminating defects present in memory devices by way of a defect management engine (DME). More particularly, the DME integrates a plurality of defective address cells and redundancy address cells within a single array. The defective address cells store the addresses for accessing defective cells in a main memory. The redundancy address cells store addresses for accessing redundancy cells within a redundancy memory. The address data in the defective address cells is compared to the address input of the DME, thereby providing a redundancy match detection scheme. When no match occurs, the DME outputs the address input of the DME, which allows the main memory to be accessed when operating in a normal mode. When a match occurs, the DME outputs the address read from the redundancy address cells, which allows the redundancy memory to be accessed when operating in a redundancy mode.

In another aspect of the invention, there is provided a defect management engine coupled to a memory device or system, the defect management engine including: a memory array comprising a plurality of groups of first address cells and second address cells, the first address cells and the second address cells respectively storing first address bits and second address bits; means for accessing at least one of the plurality of groups of the first address cells and the second address cells; means for detecting an address match condition for each of the accessed groups, wherein the first address bits of the accessed group matches inputted address bits of the defect management engine; and means for outputting the second address from the accessed group of the second address cells to extended address ports when an address match condition is detected; and means for outputting the inputted address bits to the extended address ports when the address match condition is not detected.

In a third aspect of the invention, there is provided a method of managing defects that includes the steps of: configuring the memory device in a memory array formed by a plurality of groups of first address cells and second address cells, the first address cells and the second address cells respectively storing first address bits and second address bits; accessing at least one of the plurality of groups of the first address cells and the second address cells; detecting an address match condition for each of the accessed groups, wherein the first address bits of the accessed group matches inputted address bits of the defect management engine; outputting the second address from the accessed group of the second address cells to extended address ports when an address match condition is detected; and outputting the inputted address bits to the extended address ports when the address match condition is not detected.

BRIEF DESCRIPTION OF THE DRAWINGS

The objects, features and advantages of the present invention will be apparent from the following description of the invention when taken in conjunction with the accompanying drawing, in which.

DETAILED EMBODIMENTS OF THE INVENTION

Figure 2:
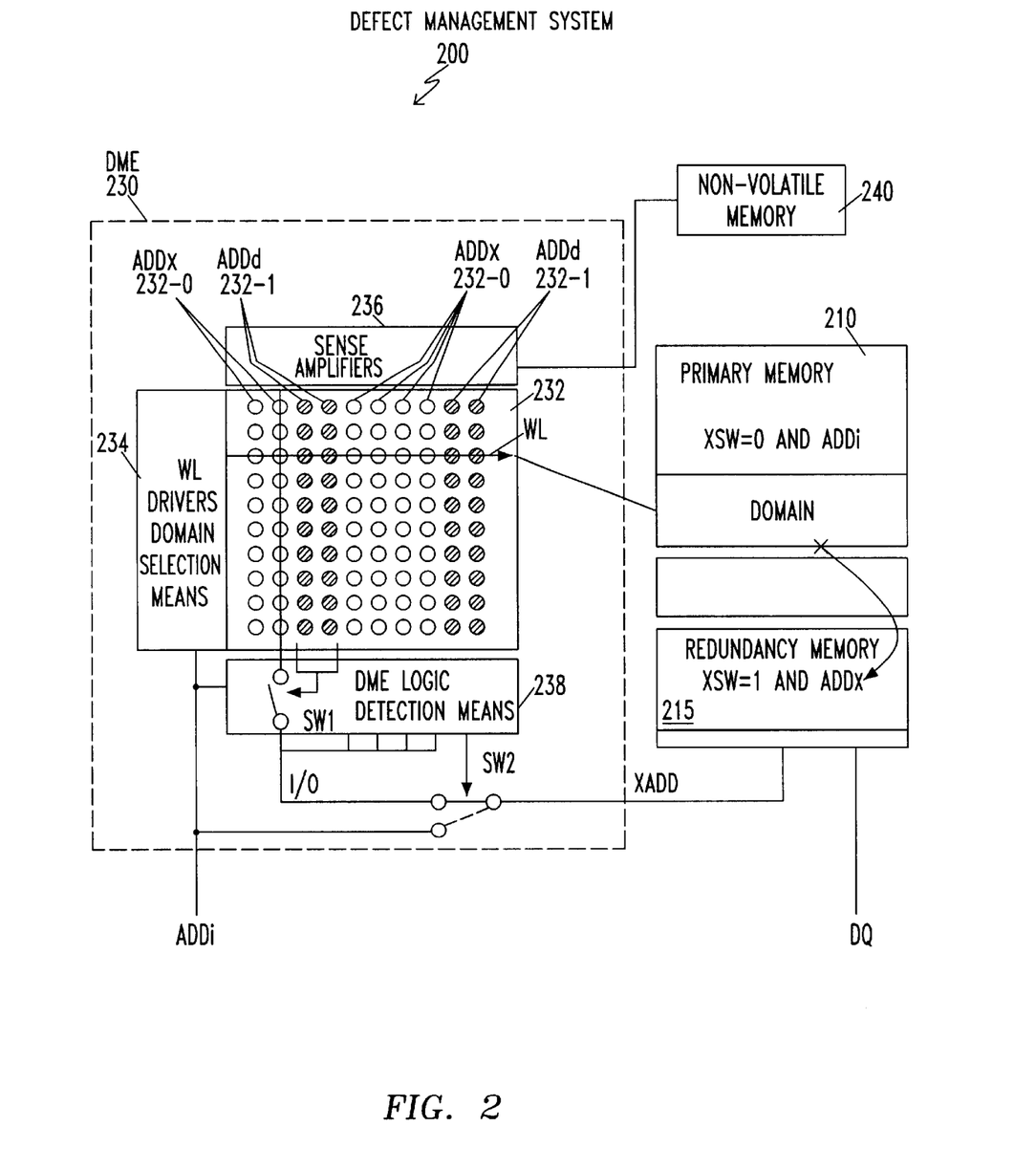
FIG. 2 is a schematic diagram of a defect management engine for address generation linked to a plurality of memories, according to the present invention.

Referring now to FIG. 2, there is shown a defect management engine DME (230) capable of generating a unified address to access memory cells in a primary memory array and redundancy cells in a redundancy memory array, according to the present invention. The defect management system (200) consists of a primary memory (210) formed by a matrix of memory cells and a redundancy memory (215) consisting of a matrix of redundancy memory cells, designed to replace defective memory cells (labeled x) within the primary memory (210). The primary memory (210) and the redundancy memory (215) may be configured as a single array, or may be arranged in a plurality of arrays. The primary memory (210) and redundancy memory (215) may also be placed in a plurality of devices within an electric system, each containing at least one memory array. The primary memory (210) and the redundancy memory (215) are controlled by the DME to achieve the generation of an "extended address". More specifically, the DME (230) generates an extended address signal (XADD) that addresses any memory cell within the primary memory (210) and redundancy memory (215), and may be viewed as a means for providing a unified address. XADD includes a bit XSW so that primary memory array (210) and redundancy memory array (215) can be selected. Bit XSW is preferably assigned to an additional bit address over the inputted address bits (ADDi) coupled to the DME (230). More particularly, cells in the primary memory (210) are selected when bit XSW within XADD is at 0. In such an instance, primary cells within the primary array are addressed with the remaining XADD bis, i.e., ADDi. Cells in the redundancy memory (215) are selected when bit XSW is at 1. In this case, the redundancy cells within the redundancy memory are addressed with address bits stored in the extended address cells within DME. A more detailed configuration of DME (230) for an extended address generation will now be described.

The DME (230) of the present invention consists of at least one memory array (232), wordline (WL) drivers (234), sense amplifiers (236), and DME logic (238). This configuration is similar to the previously described DME shown in FIG. 1f. Unlike the previous DME, the primary memory (232) includes extended address cells (232-0) and redundancy address cells (232-1). Redundancy address cells (232-1) store address bits (ADDd) to identify the defective element within the primary memory (210). Similarly, extended address cells (230-0) store the address bits (ADDx) to identify redundancy cells within the redundancy memory (215) for a possible redundancy replacement. The primary memory (210) consists of a plurality of memory cells, which may be part of a single array or of a plurality of arrays.

The primary memory (210) is preferably subdivided into a plurality of domains. For simplicity sake, the following discussion assumes a single array for the memory cells, although the invention is not limited only to this configuration alone. WLs in the DME (230) are assigned to the corresponding domain within the primarily memory (210), and support the faults within the assigned domain for the address generation to access the redundancy memory (215). More specifically, WL drivers (234) enable a domain selection circuit to assign the extended address cells (232-0) and the redundancy address cells (232-1) selected by the WL to the corresponding domain within the primary memory (210). The domain may be defined within one memory array or two or more memory arrays. Sense amplifiers (236) amplify the data from extended address cells (232-0) and redundancy address cells (232-1) simultaneously. The DME logic (238) performs a redundancy match detection in order to compare the address inputs (ADDi) to the redundancy address (ADDd) read from redundancy address cells (232-

1). This generates a MATCH condition (ADDi=ADDd) or a NO-MATCH condition (ADDi≠ADDd). A MATCH condition opens the first switch (SW1), allowing the address (ADDx) from the extended address cells (232-0) to be transferred to the node I/O. Additionally, the address bit XSW=1 is also outputted. Simultaneously, a second switch (SW2) couples the node I/O to the output of the DME, outputting the extended address (XADD), which consists of ADDx and XSW. The ADDx and XSW=1 sets XADD in a MATCH condition. When XSW is at 1, redundancy array (215) is selected, the redundancy cells being identified by way of ADDx. A NO-MATCH condition leaves SW1 closed (SW1 at 0), coupling the address input of the DME (ADDi) to the address port of DME (130), i.e., XADD. The output (XADD) of DME (230) is linked to the address input of both primary memory (210) and redundancy memory (215).

In conclusion, the DME (230) fully integrates a plurality of redundancy circuits consisting of self-contained domain selectors by WL drivers 234, self-contained redundancy match detectors 238, and self-contained extended address generator by extended address cells (232-0) and redundancy address cells (232-1), all within a single memory device, enabling in the process a variable size redundancy replacements per domain and a variable domain redundancy replacement.

DME 230 can be used in conjunction with any type of memory device including a ROM, EPROM, EEPROM, FLASH-RAM, SRAM, DRAM, and the like. Volatile memories such as an SRAM and a DRAM additionally require a non-volatile redundancy address storage because the redundancy address cells 232-1 and the extended address cells in the volatile DME 230 do not maintain the address bits when the system 200 is powered off. Before the DME is enabled to repair a defective element present in memory 210, they are copied from the memories non-volatile redundancy address storage (not shown). The non-volatile redundancy address storage includes any type of storage device capable of storing data in the absence of power. Examples include an EPROM, EEPROM, Flash-RAM, Hard disk, Floppy disk, and the like.

Figure 3:
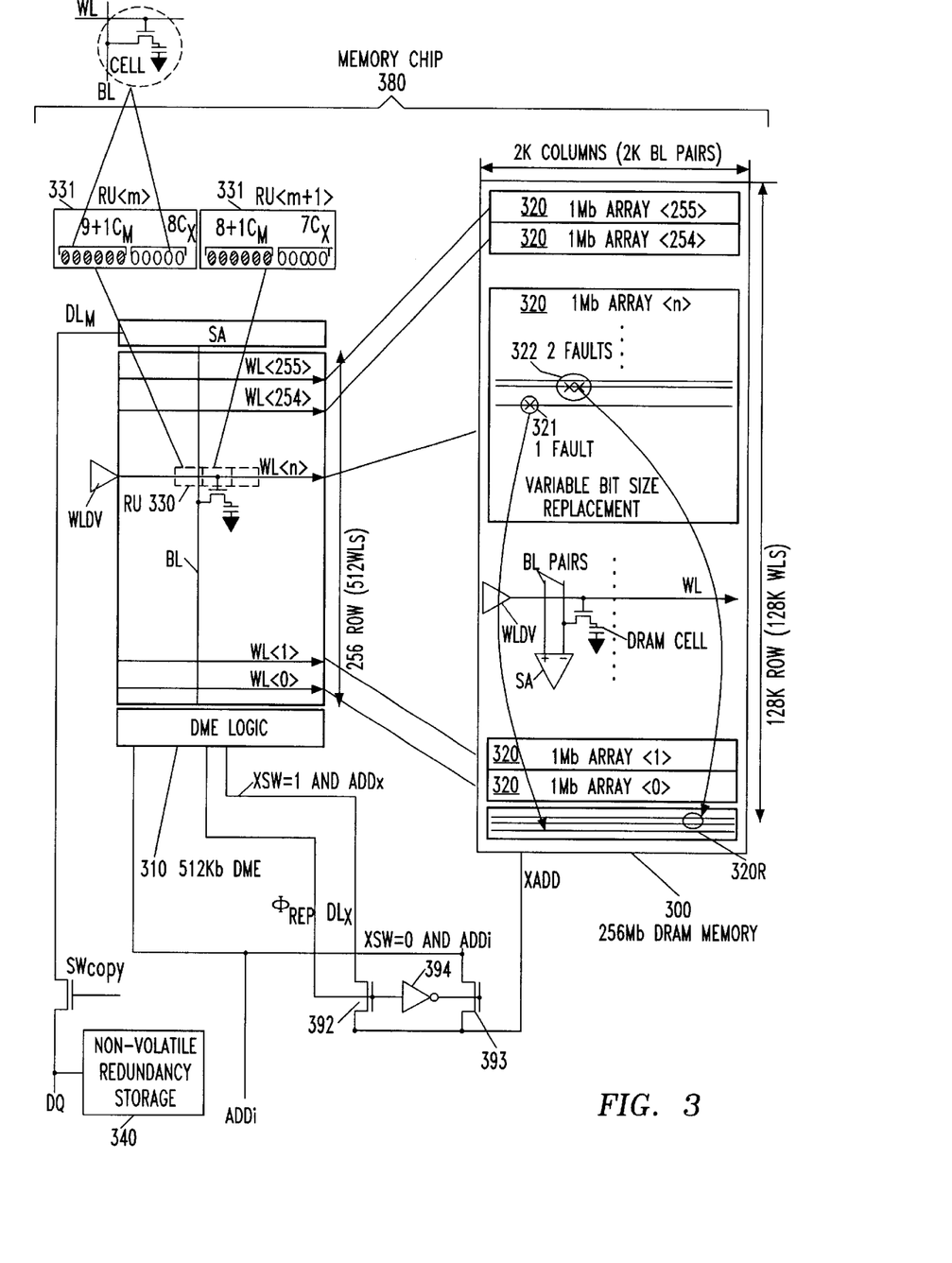
FIG. 3 is a schematic diagram of a preferred embodiment of a defect management engine applicable to a 256 Mb DRAM for address generation.

FIG. 3 shows a detailed schematic of a 256 Mb DRAM memory 300 and a 512 Kb DME 310, both integrated in a single memory chip 380. They may, if so desired, be split between two or more chips, which may include two or more 256 Mb DRAM memories 300 within the memory chip 380. Since 256 Mb DRAM memories are volatile, a non-volatile redundancy address storage 340 is added to the same memory chip, although nothing precludes it from its being incorporated in a separate chip, if so desired. During or prior to power-up, the redundancy addresses are copied from a non-volatile redundancy address storage 340 to redundancy address cells in DME 310 through data ports DQ and switch $SW_{copy}$.

DME 310 generates a signal $\phi_{REP}$ which opens one of two switches 392 and 393. The signal $\phi_{REP}$ remains at a binary low value when the DNE logic detects a NO-MATCH condition. When the signal $\phi_{REP}$ is at low, (i.e., $\overline{\phi_{REP}}$, inverted by gate 394, is at a high), NMOS 393 opens, allowing address input (ADDi) to be coupled to the output address port (XADD). An extended address (XADD) on the XADD port includes an address bit XSW bit which, when at 0, allows the cells in a primary memory consisting a plurality of 1 Mb arrays (320) to be addressed. The signal $\phi_{REP}$ stands at high when the address inputs ADDi match the redundancy addresses accessed in DME 310. When the signal $\phi_{REP}$ is at high, NMOS 392 opens, allowing the address to be read out from the extended address cells (CMs) to data line ($DL_x$). Bit XSW is set at 1, transferring extended address bits (ADDx) to the port XADD. Since XSW is at 1, the cells in the redundancy memory array (320R) are addressed for possible redundancy replacement of defective cells identified by redundancy address (ADDd). A signal $\phi_{REP}$ may preferably be used for the bit XSW.

The 256 Mb DRAM memory 300 is structured as a matrix having 128K rows by 2K columns, wherein a row and a column are respectively defined as a wordline (WL) and a bitline (BL pair). The 256 Mb DRAM memory is further sub-divided into 256 1 Mb arrays 320. The 256 Mb DRAM array also contains a 512 Kb redundancy array (320R) for replacement. However, redundancy memory cells in the 512 Kb redundancy array (320R) may be integrated in one or more 1 Mb arrays without having a redundancy array (320R). Note that 1 Mb array 320 and 512 Kb redundancy array (320R) were chosen as a preferred logical array to best describe the invention. It is not required to match the physical array boundaries by defining sense amplifiers or wordline drivers in the 256 Mb DRAM memory 300. Note further that each 1 Mb array is to be viewed as a domain used for replacement purposes. It is managed by the corresponding WL in DME 310, in a manner which shall be discussed hereinafter.

The 512 Kb DME 310 is structured as a matrix having 256 rows (WLs) by 2K columns (BL pairs). 256 WLs in the engine 310 are assigned to the corresponding 1 Mb array (domain) for management purposes: WL<0> is assigned to array<0>, WL<1> to array<1>, ..., WL<254> to array<254>, and WL<255> to array<255>. Note that this domain assignment is to be used for illustrative purposes only; therefore, one WL may be assigned to two or more arrays, or to a partial area within an array that defines the domain. The domain size may not coincide with the aforementioned variable domain redundancy replacement. Further details regarding variable size domains may be found in the aforementioned U.S. Pat. No. 5,881,003.

Unlike conventional redundancy replacement methodology, DME 310 includes a redundancy address cell $C_M$ and an extended address cell (Cx). $C_M$ stores a redundancy address bit (ADDd) which identifies the address of the defective element present in the corresponding domain of 256 Mb DRAM memory 300. $C_x$, stores an address bit (ADDx) which identifies the address of the redundancy element present in redundancy array (320R) for possible replacement of defective elements identified by way of ADDd.

As previously discussed, the redundancy address and the corresponding extended address for a possible replacement is copied from the non-volatile redundancy storage 340 to the corresponding $C_M$ and $C_x$ during the power-on phase, respectively. The power-on can be detected by a voltage source transistor, well known in the art. Note that cells $C_M$ and $C_x$ are logic assignments which can physically be part of the same or belong to a different cell structure. A defect management unit RU, i.e., a logic unit designated for repair purposes, is designed with one or more $C_M$S and one or more $C_x$S, all of which are assigned to continuous adjacent cells along the wordline WL. The number of cells 331 and 332 may vary from one configuration to the next. This makes it possible to have a variable size redundancy replacement configuration, such as 1 wordline, 2 wordlines, etc. For simplicity sake, the following discussion assumes a variable size row redundancy replacement. However, this concept is also applicable to column redundancy replacement with or without variable size features. This invention is also applicable to a single, multi-bit, or variable bit size redundancy replacement with appropriate modifications, fully described in the aforementioned U.S. patent application Ser. No. 09/243,645.

The variable size row redundancy element is realized by following the number of redundancy address bits $C_MS$ (+1 for enabling) used for decoding the defective WLs replaced simultaneously with redundancy Wls (RWLs). Similarly, the number of extended address should follow the number of extended address bit (+1 for enabling) that decode the RWLs for the replacement. By way of example, in order to replace a single WL, e.g., 321, within the corresponding 1 Mb array<n>, a repair unit RU<m>331 consisting of 9 $C_M$ used for selecting 1 out 512 WLs (+1 for enabling purposes), and 8 $C_x$, for selecting a RWL in a 512 Mb redundancy array (320R). Now, RU<m+1>332 consisting of 8 $C_MS$ (+1 for enabling purposes) and 7 $C_xS$ replaces two WLs 322 within the 1 Mb array<n> with 2 RWLs simultaneously in the redundancy array (320R). This results in a variable size row redundancy replacement having one RWL and two RWLs for each repair.

The DME makes it possible to configure approximately 100 RUs within one WL, allowing some 100 to be repaired within each 1 Mb domain (or 25.6K/chip). For a 256 Mb DRAM, it represents more than 10 times the capacity of repairing than that obtained using a conventional redundancy approach. One WL<n>, consisting of one or more defect management units RUs (e.g., RU 331–332), are activated and amplified simultaneously when WL in the corresponding array<n>, used as a domain, is activated by wordline driver WLDV in the 256 Mb DRAM by the same sense amplifier SA. For simplicity sake, it is assumed that only one array<n> is activated at a time in the 256 Mb array 300.

Figure 4:
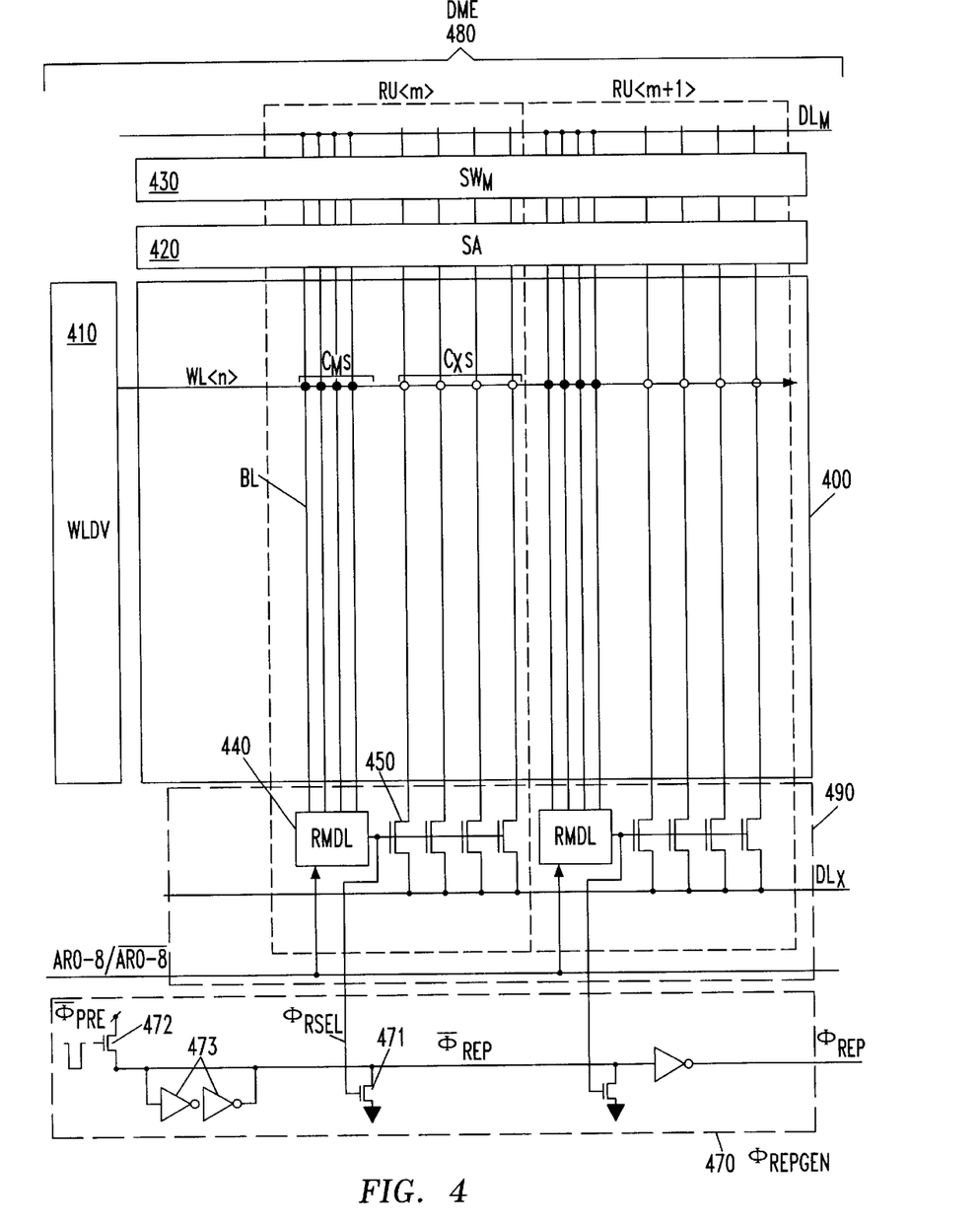
FIG. 4 illustrates a more detailed block diagram of the defect management engine for address generation shown in FIG. 2.

FIG. 4 shows a detailed schematic of the defect management engine DME 480, consisting of DRAM array 400, wordline driver block WLDV 410, sense amplifier block SA 420, write switch block $SW_M$ 430 (to service $C_MS$), defect management logic block 490, and generator block $\phi_{REP}$GEN 470 (which generates the signal $\phi_{REP}$ that controls the necessary switches). In this example, SA 420 and $SW_M$ 430 are placed on opposite sides of the DME logic block 490 and of the generator block $\phi_{REPGEN}$470. This is done for illustrative purposes only, since they could equally well be placed on the same side. Each WL<n> for the corresponding domain<n> consists of one or more repair units RUs, each with the appropriate $C_MS$ and $C_xS$, to enable a variable size row redundancy replacement. When (or before) the system is powered up, DME 480 is enabled by detecting a power source voltage transition. Switch $SW_M$. 430 opens, allowing the redundancy address and the corresponding extended address information to be written to the $C_M$. and CX by coupling a data line $DL_M$, to a bitline BL. During defect management operation, one of the 256 WLs corresponding to the1 Mb domain in the 256 Mb array rises. This allows data in the $C_M$ and $C_x$ to be read by the BL pairs. This data is amplified by SAs 420 as it is conventionally done in a DRAM operation. Simultaneously, a plurality of redundancy match detection units RMDL 440 receives row address inputs AR0-8 and the complement inputs $\overline{AR0\text{-}8}$. This allows each RMDL 440 to compare the row address inputs AR0-8 to the redundancy row address stored in the $C_MS$ designed to store the redundancy address, which were already amplified by the sense amplifiers SA 420.

The following discussion describes the operation of a replacement unit, e.g., RU<m> for.

When the row address inputs match the row redundancy address bits stored in $C_MS$, signal $\phi_{RSEL}$ switches to high, opening switch 450 that couples BL to $DL_x$. This outputs the extended address bits in $C_x$. $\phi_{REP}$GEN consists of pre-charged device 472, latch 473, and wired-OR NMOS 471, the gate of each being coupled to the corresponding $\phi_{RESEL}$. The wired-OR node $\phi_{REP}$ is pre-charged to high by $\phi_{PRE}$, which discharges when at least one of the $\phi_{RSEL}$ switches to high, when an address match condition is detected, forcing $\phi_{REP}$ to high. In summary, signals $\phi_{REP}$ and $\overline{\phi_{REP}}$ remain at high and low, respectively, only when one of the RMDL detects the presence of a redundancy replacement mode.

Figure 5:
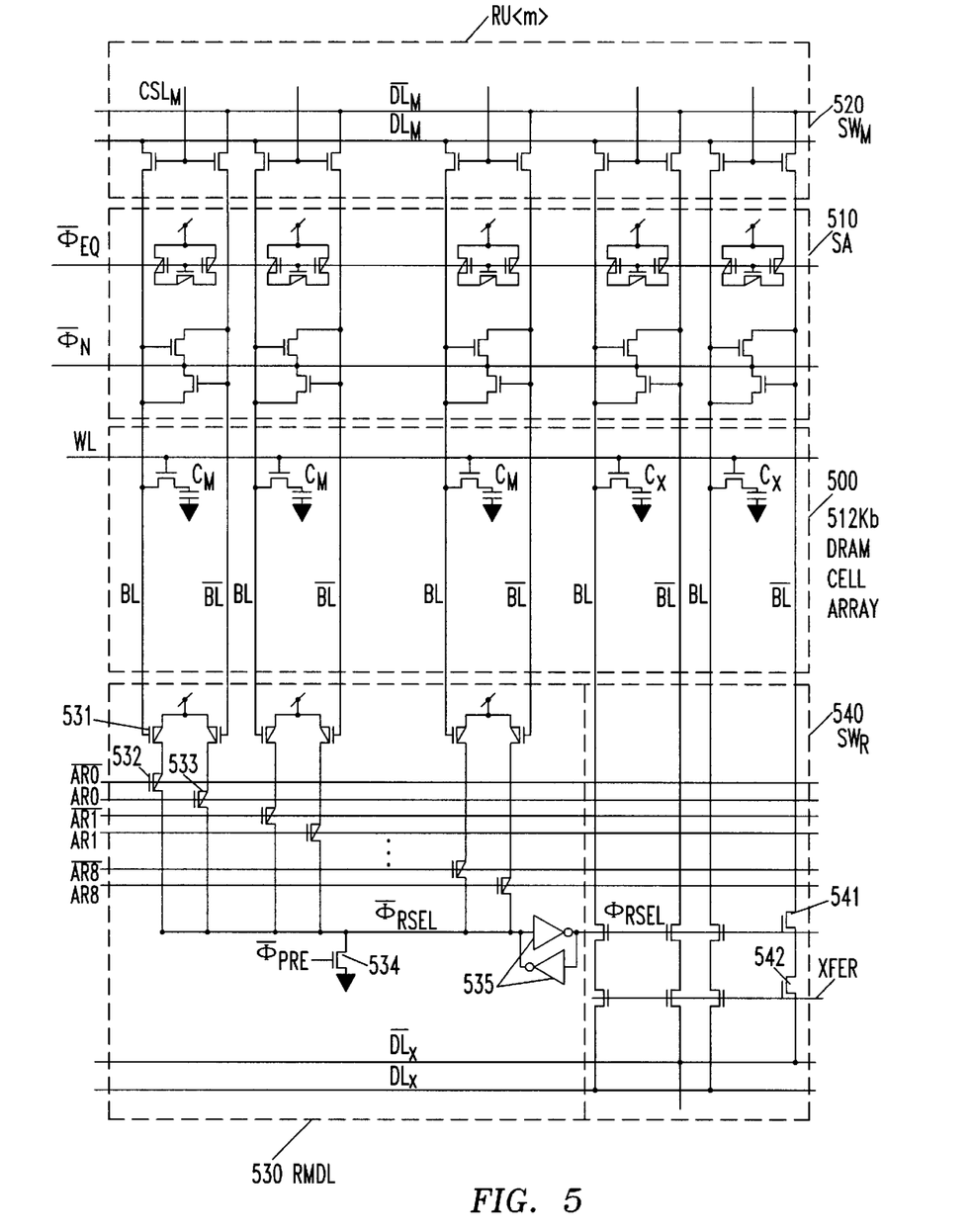
FIG. 5 illustrates a transistor implementation of the defect management engine for address generation shown in FIGS. 2 and 4.

FIG. 5 is a detailed version of the circuit used for repairing unit RU<m>, wherein a 512 Kb DRAM cell array 500 consisting of $C_M$ and $C_x$, NMOS SA 510, $SW_M$ 520, defect management logic consisting of RMDL 530, and switch $SW_R$, 540, is discussed. A Vdd pre-charge sensing arrangement consisting of NMOS SA 510 is assumed for this discussion. However, the concept is equally applicable to other sensing configurations. The Vdd pre-charge sensing arrangement requires either a reference cell or twin cells, well known by practitioners in the art, but which, for simplicity sake, will be ignored in this discussion. During the power-on phase, WL, one for each row cycle, and $CSL_M$, one for each column cycle, of the 512 Kb DRAM array 500 is sequentially activated to copy the redundancy address bits and the corresponding extended address bits to the corresponding $C_M$ and $C_x$ through the data line pair $DL_M$ and complement $\overline{DL_M}$. This example assumes copying address bits one by one; however, two or more address bits can be copied by activating two or more CSLMs. Their addressing accesses the corresponding WL or $CSL_M$ that are controlled either externally by the memory system or internally by the chip. When the defect management engine receives a first row address, $\overline{\phi_{EQ}}$ switches to high, disconnecting all BL pairs from power supply Vdd. One of the 512 WLs is then activated, and a corresponding SA block 510 is set, as it is typically done in a conventional DRAM operation. When the engine receives the first column address, the first WL rises, coupling the data line $DL_M$, pair to the first BL pair (see FIGS. 2 and 4). This allows the first redundancy address bit to be written into the first $C_M$. The engine then receives the second column address, activating the second $CSL_M$, and allowing the second redundancy address to be written into the second $C_M$. The same operation continues until all $C_MS$ along the first WL have been successfully written for $C_mS$ and $C_xS$. A similar operation is repeated for other WLs until all the $C_mS$ and $C_xS$ in all WLs store the appropriate redundancy addresses.

For defect management purposes, the BL pairs are also coupled to the gate of PMOS pairs 531, the sources of which are coupled to the power supply Vdd. The two PMOS 531 forming the pair are respectively coupled to PMOS 532 and PMOS 533. PMOS 532 and PMOS 533 are coupled, respectively, to the row addresses (i.e. AR0) and complement row address (i.e. $\overline{AR0}$). The respective drains of PMOSs 532 and of PMOS 533 are attached to the common wired NAND node $\overline{\phi_{RSEL}}$. The node $\overline{\phi_{RSEL}}$ is pre-charged to ground by NMOS 534 which, in turn, is controlled by the pulsed signal $\overline{\phi_{PRE}}$. The node $\overline{\phi_{RSEL}}$ is also latched by CMOS latch 535. The signal $\overline{\phi_{RSEL}}$ is inverted by latch 535. The output $\phi_{RSEL}$ is coupled to NMOS 541. NMOS 541 is a control switch that links the BL pair for a corresponding CX to the data-line $DL_x$, pair, when $\phi_{SEL}$ switches to high.

During a management operation, one of 256 WLs corresponding to the selected domain into the 256 Mb DRAM memory rises after the BL equalizing signal $\overline{\phi_{EQ}}$ switches to high. Cells $C_M$ and $C_R$ are coupled to the corresponding BLs. Following the signal generation, sense signal $\overline{\phi_N}$. switches to low, activating NMOS SA 510. This allows one of the BL pairs to shift to low, enabling one of the two PMOS forming the pair 531. Simultaneously, row addresses $\overline{AR0\text{-}9}$ and complement addresses AR0-9 are provided to RMDL 530. When both, BL and AR switch to low; then, PMOS 531 and PMOS 532 (or 533) switch ON, pre-charging the signal $\overline{\phi_{RSEL}}$. This results in a normal operation. $\phi_{SEL}$, therefore, switches to low. Switching $\phi_{REP}$ to low disables NMOS 541. When neither pair of serially connected PMOS 531 and 532 (or 533) is ON, $\phi_{REP}$ and $\overline{\phi_{REP}}$ remain at low and high, respectively, keeping switch NMOS 541 open and coupling the data line pair $DL_x$ to the corresponding BL. This provides extended address bits to be outputted through data line pair $DL_x$ via NMOSs 542, when signal XFR arrives once the BL sensing has been enabled by signal $\overline{\phi_N}$.

While the invention has been described in terms of several preferred embodiments, various alternatives and modifications can be devised by those skilled in the art without departing from the spirit and scope of the invention. Accordingly, the present invention is intended to embrace all such alternatives which fall within the scope of the appended claims.

What is claimed is:

1. A defect management engine comprising:

a memory array comprising a plurality of groups of first address cells and second address cells, said first address cells and said second address cells respectively storing first address bits and second address bits;

means for accessing at least one of said plurality of groups of said first address cells and said second address cells;

means for detecting an address match condition for each of said accessed groups, wherein the first address bits of said accessed group matches inputted address bits of said defect management engine;

means for outputting the second address from said accessed group of said second address cells to extended address ports when an address match condition is detected; and means for outputting said inputted address bits to said extended address ports when said address match condition is not detected.

2. The defect management engine recited in claim 1 further comprising means for outputting an additional address bit to said extended address ports to identify a MATCH and NO-MATCH condition.

3. The defect management engine as recited in claim 2, wherein said first address is a redundancy address to identify defective elements in said primary memory.

4. The defect management engine as recited in claim 3, wherein said second address identifies redundancy elements in said redundancy memory.

5. The defect management engine as recited in claim 4, wherein said address ports are coupled to said primary memory and to said redundancy memory, and wherein defective elements in said primary memory are replaced with redundancy elements within said redundancy memory.

6. The defect management engine as recited in claim 5, further comprising means for programming said first addresses and said second addresses.

7. The defect management engine as recited in claim 6, wherein addresses stored in said address cells are non-volatile.

8. The defect management engine as recited in claim 6, wherein addresses stored in said address cells are a volatile memory.

9. The defect management engine as recited in claim 8, wherein said programming means replicates said first addresses and said second addresses stored in a non-volatile redundancy address storage means.

10. The defect management engine as recited in claim 9, wherein said means for programming is activated during system power-up.

11. The defect management engine as recited in claim 10, wherein said system power-up is detected by a voltage source transition.

12. The defect management engine as recited in claim 9, wherein said means for programming is enabled by a command from said system.

13. The defect management engine as recited in claim 9, wherein said means for programming replicates said addresses into said address cells by sequentially activating each of said first and second address cells.

14. The defect management engine as recited in claim 9, wherein said means for programming replicates said addresses into said address cells by simultaneously activating at least two of said first and second address cells.

15. The defect management engine as recited in claim 5 further comprising means for enabling a variable size redundancy replacement.

16. The defect management engine as recited in claim 5 further comprising means for enabling a variable domain redundancy replacement.

17. A method of generating a unified address to access memory cells in a primary and a redundancy array, the method comprising the steps of:

configuring a primary and a redundancy memory array respectively formed by a plurality of groups of first address cells and second address cells, said first address cells and said second address cells respectively storing first address bits and second address bits;

accessing at least one of said plurality of groups of said first address cells and said second address cells;

detecting an address match condition for each of said accessed groups, wherein the first address bits of said accessed group matches inputted address bits of said defect management engine;

outputting the second address from said accessed group of said second address cells to extended address ports when an address match condition is detected; and outputting said inputted address bits to said extended address ports when said address match condition is not detected.

18. The method as recited in claim 17 further comprising means for outputting an additional address bit to said extended address ports to identify a MATCH and NO-MATCH condition.

19. The method as recited in claim 18, wherein said first address is a redundancy address to identify defective elements in said primary memory.

* * * * *